United States Patent [19]

Giuffre et al.

[11] Patent Number: 5,043,586
[45] Date of Patent: Aug. 27, 1991

[54] PLANARIZED, REUSABLE CALIBRATION GRIDS

[75] Inventors: George J. Giuffre, Wappingers Falls; Maris A. Sturans, Poughquag; James F. White, Newburgh; Robert R. Wilbarg, Hopewell Junction, all of N.Y.

[73] Assignee: International Business Machines Corporation, Armonk, N.Y.

[21] Appl. No.: 603,137

[22] Filed: Oct. 25, 1990

[51] Int. Cl.⁵ .............................. H01J 37/304
[52] U.S. Cl. .............. 250/491.1; 250/252.1; 250/492.2
[58] Field of Search ............... 250/491.1, 492.2, 252.1

[56] References Cited

U.S. PATENT DOCUMENTS

| | | | |
|---|---|---|---|
| 3,982,837 | 9/1976 | Cummins | 356/168 |
| 4,056,730 | 11/1977 | Davis et al. | 250/492 R |
| 4,390,789 | 6/1983 | Smith et al. | 250/492.2 |
| 4,397,937 | 8/1983 | Clecak et al. | 430/192 |
| 4,442,361 | 4/1984 | Zasio et al. | 250/492.2 |
| 4,467,211 | 8/1984 | Smith et al. | 250/492.2 |
| 4,665,315 | 5/1987 | Bacchetti et al. | 250/492.2 |
| 4,728,799 | 3/1988 | Gordon et al. | 250/492.2 |
| 4,885,472 | 12/1989 | Young | 250/491.1 |

OTHER PUBLICATIONS

IBM Technical Disclosure Bulletin, vol. 14, No. 2, Jul. 1971, pp. 417-418, "Fabricating Shaped Grid and Aperture Holes" by R. A. Leone and C. H. Ting.

"Correction of Non-Linear Distortion in a Direct Exposure Electron Beam System" by H. Engelke, J. F. Loughran, M. S. Michall & P. M. Ryan; IBM J. Res. Develop., Nov. 1977, pp. 506-513.

"Registration Mark Detection for Electron-Beam Lithography-ELI System" by Donale E. Davis, IBM J. Res. Develop.; vol. 24, No. 5, Sep. 1980.

Primary Examiner—Jack I. Berman
Attorney, Agent, or Firm—Whitham & Marhoefer

[57] ABSTRACT

An improved structure for electron beam lithography grids and a method of fabricating such grids yields calibration grids having grid lines coplanar with the surface of a the grid body and laterally supported by grooves formed in the grid body and which can also be cleaned after contamination by outgassing resist during use by virtue of the provision of such lateral support for the grid lines. The grid exhibits improved accuracy due to the technique of fabrication of the grooves. The invention thus allows the electron beam lithography process to be conducted with less expense and at a greater speed. The improved accuracy of the calibration grid also permits integrated circuits and masks used in the fabrication of such devices to be designed more flexibly and fabricated at reduced cost and improved integration densities and manufacturing yields.

13 Claims, 1 Drawing Sheet

PLANARIZED, REUSABLE CALIBRATION GRIDS

BACKGROUND OF THE INVENTION

1. Field of the Invention

The present invention generally relates to calibration grids usable in electron beam lithography apparatus and, more particularly, to a structure and method of fabrication for reusable, planarized calibration grids which are relatively insusceptible to damage and easily cleanable which results in increased manufacturing yields.

2. Description of the Prior Art

In processes for the fabrication of semiconductor and other devices, it is common to achieve patterning of a layer by covering the layer with a resist, sensitizing the resist in selected areas so that exposure to a chemical agent will cause a reaction resulting in the removal of the resist material from either selected or non-selected areas of the layer. Thereafter, further layers can be deposited or portions of the layer removed by additional processes such as chemical or plasma etching, sputtering, vapor deposition and the like. These processes may be performed numerous times in the fabrication of complex semiconductor integrated circuits.

The step of sensitizing of areas of the resist can be done in many ways and numerous resists have been developed to be sensitized by exposure to different sensitizing agents such as light, ultraviolet radiation, electron beams, X-rays, etc. Since the resolution of the patterning of the resist layer is limited by the wavelength of radiation used to sensitize the layer, optical patterning has given way to electron beam lithography as the size of elements in the integrated circuit has diminished and the degree of integration has increased. A discussion of electron beam lithography, resists and related matters can be found in "VLSI Handbook", Norman G. Einspruch, editor, Published by Academic Press, Inc., Orlando, Florida, 1985, particularly at pages 328-380.

While electron beam lithography can be used for directly patterning resists used in the formation of a chip, it is much more often employed in the fabrication of masks which are subsequently used for optical, ultraviolet or x-ray sensitization of the resists during fabrication of chips. The reason for this is that electron beam lithography is necessarily serial in nature and the throughput using mask exposures is much higher. However, in densely integrated circuits, the formation of masks requires a stepping camera to replicate the elemental patterns at numerous locations which is a multistep process which must also be performed serially. In comparison with other serial processes, electron beam lithography is extremely fast and requires only a single step to pattern a portion of the resist for a mask. Therefore, the throughput for mask formation with electron beam lithography is several orders of magnitude greater than with optical techniques. The resolution of such masks produced by electron beam lithography is also fully compatible with X-ray lithography for manufacture of the chips.

As with any lithographic process, alignment and calibration are critical for producing articles, such as chips or masks, with high geometric accuracy. Electron beam lithography, being a serial process, potentially allows such alignment and calibration to be done often during the sensitization process. In electron beam lithography, calibration is done with the aid of a calibration grid. Typically, the beam will be swept to locate a grid position and then deflected by a precise distance from such a datum point to a point where impingement of the beam is desired. High accuracy may be enhanced through the use of correction look-up tables, error measurement and smoothing and various interpolation techniques such as spline-fitting to reduce positioning errors to the order of 30 ppm. These techniques are discussed in more detail in "Correction of Nonlinear Deflection Distortion in a Direct Exposure Electron-Beam System" by H. Engelke et al., IBM J. Res. Develop., November 1977. However, all of these techniques rely on the accuracy of the sensing of beam position by means of a calibration grid placed in the exposure field of the beam and, therefore, the grid and the accuracy thereof is critical to the electron beam lithographic process.

A calibration grid as known in the prior art is formed by an array of orthogonal lines of gold on a substrate or body which is typically of silicon or similar semiconductor material. The array of gold lines intersect to form approximately one thousand square holes in the gold layer, each square measuring, typically, 25 $\mu$m on a side and at a typical spacing, on centers, of 37.5 $\mu$m. Measurement of beam position is accomplished by detecting changes of backscatter of electrons as the beam is swept across the calibration grid. Backscatter occurs more strongly when the beam impinges on the more dense gold than on the relatively less conductive surface on which the grid is formed. By scanning the calibration grid and noting the times of change of backscatter, deviation from ideal times and ideally linear sweeps can be discovered and corrections developed. Nevertheless, many sweeps per hole of the calibration grid are necessary to allow compensation for the edge roughness of the gold lines forming the grid which is a significant source of positioning error. Further, while the gold lines are relatively thin, the surface of the gold layer is not coplanar with the surface of the grid, causing a certain degree of parallax error and an additional component of the problem of edge roughness.

While extremely high accuracy can be achieved by this arrangement, several problems have been encountered. The grid, itself, must be fabricated by a technique very similar to that employed to form integrated circuits and masks. Although calibration grids are of relatively simple structure, the size of approximately one inch, square, the number and length of lines and the extremely low fault tolerance for the intended use combine to significantly reduce manufacturing yields and raise costs. Consider, for instance, that redundant structures can be fabricated on integrated circuit chips but not on calibration grids and that any width variation in the gold lines greater than irreducible edge roughness when the lines are formed with the known "lift-off" process will render the grid unusable whereas a line must be broken or be so thin as to cause a substantial resistance to cause a fatal defect in an integrated circuit. Also, since they cannot be encapsulated, mechanical damage and contamination also reduce manufacturing yields.

The "lift-off" process by which calibration grids known in the art are typically made includes, as shown in FIG. 1a, the formation of a multilayer resist including a stand-off layer 11, placed on the grid surface of a substrate 10, an intervening layer 12 placed on the stand-off layer 11 and an imaging layer 13 placed on the intervening layer 12. To improve adhesion of gold to areas of the substrate or body 10, it is common to also include a thin layer of chromium (not shown) between the surface of the substrate, either before applying the resist or at least before deposition of the gold. It is also common to provide a layer of silicon oxide on the surface of substrate 10, indicated by the dotted line in FIG. 1a. After patterning of the imaging layer by selective sensitization, for example, by exposure to light 14, patterns 15 in the imaging layer, shown in FIG. 1b, are etched through the intervening and stand-off layers by ion etching. Then, as shown in FIG. 1c, a gold layer 16 is formed over the entire surface of the grid. When the remaining multi-layer resist is removed from the grid, as shown in FIG. 1d, the overlying areas of gold are also lifted off, leaving only the gold 17 which has reached the grid surface during deposition. This process will also result in some unavoidable degree of edge roughness of the gold lines as indicated at 18 of FIG. 1d. Some thickness variation will also inevitably occur as indicated at 19c of FIG. 1d. While this process is preferable to others known in the art the proportion of defective grids is significant and the yield is relatively low.

Contamination of the grid during use also reduces the useful lifetime of a calibration grid. During the patterning of a resist, material will be outgassed from the resist. Due to the proximity of the grid to the exposed resist, purging of the outgassed material by the evacuation system of the electron beam lithography apparatus cannot be adequately complete to prevent the material from depositing on the grid and particularly the gold lines thereon. When the electron beam again impinges of the grid, the deposited hydrocarbon material is hardened and becomes somewhat conductive, tending to charge to a certain level and then to discharge by conduction. The conductive lumps 19 on the grid lines may significantly change the effective dimensions 19a and locations of the areas 19b in which strong backscattering will occur, yielding unpredictable significant positioning errors of the beam. Also, although the effect is small, height variation 19c in the gold grid lines will produce some parallax error 19d if the beam, indicated by a chain line, is not vertical when it impinges on the calibration grid. This parallax error may fluctuate with the height of the deposited grid line.

More importantly, the effect of charging, even of the grid itself, causes local deflection of the electron beam, causing very significant errors in calibration. Therefore, the grid must be highly conductive. The tendency of the hydrocarbon lumps to charge and discharge causes the local deflection to be time-variable, making extrapolation of exposure location on the surface to be exposed even less reliable. Since this form of contamination can occur during patterning of a resist layer of a mask or integrated circuit, the manufacturing yield of such masks or integrated circuits will also be reduced, increasing the costs attributable to the calibration grid. Once contaminated in this manner, the grid cannot be cleaned or reused since the softness of the gold particularly compared to the hardness of the hydrocarbon material and the exposed location and poor adhesion properties, even with the use of a chromium interlayer structure causes fatal defects to be engendered in the calibration grid by any known cleaning process which might be employed.

From the above, it is seen that while high positioning accuracy can be achieved through the use of a calibration grid, the structure of the grid causes substantial expense which is attributable to the electron beam lithography process.

It was noted above that the resolution of a sensitization process is theoretically limited by the wavelength of the exposure medium such as light, electron beam, x-rays, etc. In practice, the accuracy of exposure positioning imposes a limit on the integration density on the integrated circuit or feature density, as applied to a mask or other device, which may be fabricated by electron beam lithography. For this reason, it is common to utilize semiconductor structures which are tolerant of misregistration and mislocations of areas of particular layers and groups of layers. It is also common practice to impose design rules which do not fully exploit potentially available density of element location to allow for errors of positioning due to the disadvantages of prior calibration grid structures.

SUMMARY OF THE INVENTION

It is therefore an object of the present invention to provide a calibration grid structure which can be fabricated by a process which is relatively inexpensive but which will produce good yields of calibration grids.

It is another object of the invention to provide a grid structure having reduced grid line edge roughness.

It is a further object of the invention to provide a grid structure in which the surface of the grid lines may be made substantially coplanar with the grid surface.

It is another further object of the invention to provide a reusable calibration grid which can be cleaned and is relatively insusceptible to damage during cleaning and similar processes.

It is yet another object of the invention to provide a method of making a calibration grid which is relatively inexpensive but which will produce improved yields of calibration grids.

It is yet another further object of the invention to enable the production of products having a high feature density by the use of a calibration grid which offers superior calibration accuracy, is cleanable and reusable, and/or allows a reduced or eliminated degree of charging to minimize positioning errors.

In order to achieve the above and other objects of the invention, a calibration grid is provided comprising a body having at least one groove in an exterior surface thereof and a material located in the groove having an electron backscattering characteristic which substantially differs from that of the body.

According to another aspect of the invention, a grid is provided comprising a body and grid lines, the grid lines being located at a surface of the body wherein the grid body includes means for laterally supporting said grid lines in a direction parallel to the surface.

According to a further aspect of the invention, a method of making a grid is provided including the steps of providing lateral support for grid line material located at an exterior surface of a body and polishing the exterior surface of said body to form a planar surface.

In accordance with another further aspect of the invention, a method of operating an electron beam lithography machine having a calibration grid is provided including the step of cleaning the calibration grid.

In accordance with yet another aspect of the invention, a product made by a process including an electron beam lithography step performed by an electron beam lithography apparatus including a calibration grid is provided wherein the electron beam lithography step includes cleaning the calibration grid.

In accordance with a yet further aspect of the invention, a product made by a process including an electron beam lithography step by an electron beam lithography apparatus including calibrating said electron beam lithography apparatus with a calibration grid is provided wherein the calibration grid comprises a body and grid lines having an electron backscattering characteristic substantially differing from that of said body, the grid lines being located at a surface of said body and wherein the body includes means for laterally supporting the grid lines in a direction parallel to the surface of the body.

In accordance with yet another further aspect of the invention, a method of cleaning a calibration grid for an electron beam lithography machine is provided including a step of polishing a surface of said calibration grid.

BRIEF DESCRIPTION OF THE DRAWINGS

The foregoing and other objects, aspects and advantages will be better understood from the following detailed description of a preferred embodiment of the invention with reference to the drawings, in which:

FIG. 1d illustrating the cross-section of the completed grid with unavoidable errors and contamination defects, FIG. 2d illustrating the cross-section of the completed calibration grid.

DETAILED DESCRIPTION OF A PREFERRED EMBODIMENT OF THE INVENTION

Figure 1A:
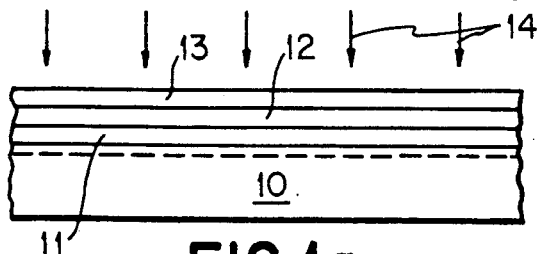
FIGS. 1a, 1b, 1c and 1d are sectional views of a conventional calibration grid and illustrating steps in the production thereof.
Figure 2A:
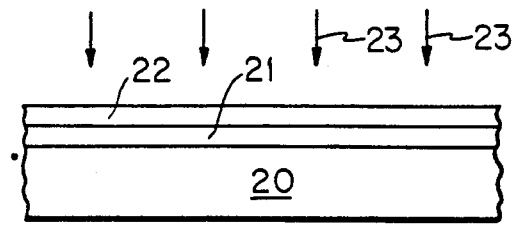
FIGS. 2a, 2b, 2c and 2d are sectional views of a calibration grid according to the invention and illustrating steps in the production thereof, also in accordance with the invention.
Figure 1B:
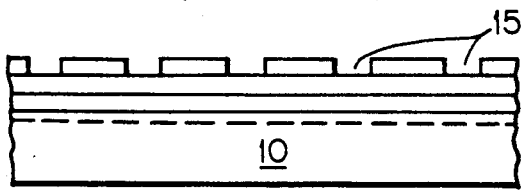
Figure 2B:
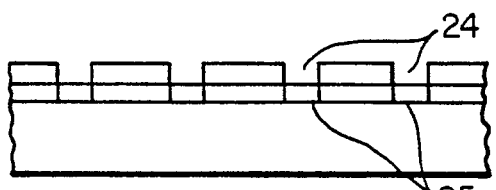
Figure 1C:
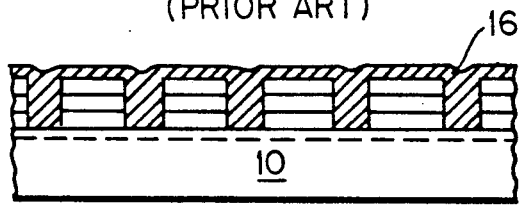
Figure 2C:
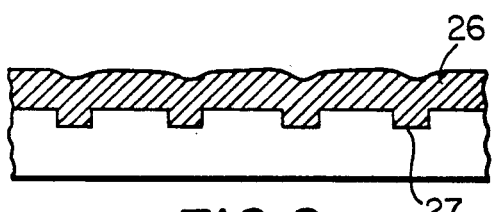
Figure 1D:
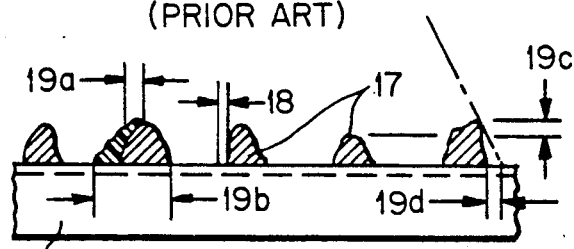
Figure 2D:
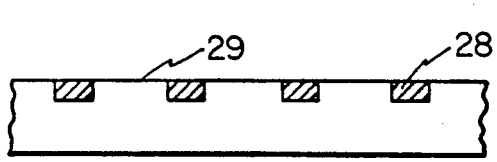

Referring now to the drawings, and more particularly to FIG. 2d, there is shown a completed calibration grid in accordance with a preferred embodiment of the invention. This structure is characterized by the fact that the lines of the grid are formed at the surface and within the bulk of the substrate or body as contrasted with the conventional structure of FIG. 1d where the grid lines are formed in a position raised above the surface. The invention, as will be explained in greater detail below, has a very well-defined edge to the trenches in which the metal is laid to provide a high degree of edge regularity and acuity as compared to the prior art. This increased edge acuity can reduce the number of times a calibration grid must be scanned in order to provide correction data values which statistically represent the actual features of the grid and are sufficiently free of noise arising from roughness of the grid line edges. Further, the surface of the grid is planarized and coplanar with the surface of the supporting substrate. This feature is important and yields significantly improved results, compared with the calibration grid of the prior art in electron beam lithography devices. This has been demonstrated by the superior accuracy of the Variable Axis Immersion Lens (VAIL) which maintains constant resolution and perpendicular beam landing at all points of the deflection field. By providing lateral support for the grid lines, the calibration grid, according to the invention is made cleanable since the surface can be renewed by polishing, in the same manner as its formation which will be described in greater detail below, or cleaned by chemical cleaners without dislodging the grid lines.

Figure 3:
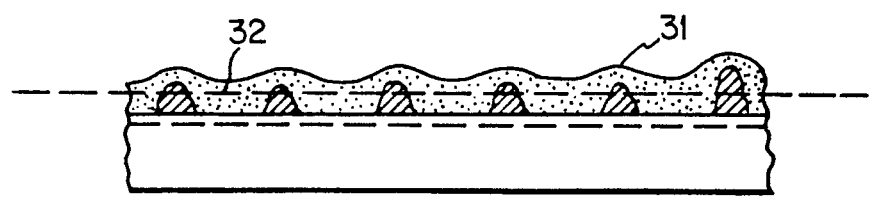
FIG. 3 is a cross-sectional view illustrating an alternative form of the invention.

It should be noted in this regard, that the prior art grid can be modified within the scope of the present invention to be similarly cleanable by overlaying the prior art structure with another layer of silicon 31 and then polishing the surface to planar form indicated by line 32 in FIG. 3. However, this would preferably be carried out during initial manufacture and is not preferred since such a procedure would not accomplish the avoidance of grid line edge roughness characteristic of the preferred embodiment of the invention.

Referring now to FIGS. 2a–2d, the preferred embodiment of the invention is preferably made by first forming an oxide layer 21 on the surface of substrate or body 20. Many suitable methods are known for performing this step. Next, a resist layer 22 is applied and sensitized as indicated by arrows 23 in FIG. 2a. The resist is preferably similar to those disclosed in U.S. Pat. No. 4,397,937 to Clecak et al. and assigned to the assignee of the present invention, which is hereby incorporated by reference. The particular resist is not critical to the practice of the invention and other resists can be used, as well. The portions of the resist at locations 24 are then removed. It should be noted in this regard that either negative or positive resists can be employed.

The substrate and the oxide in areas 25 are then etched through to or somewhat beyond the substrate surface by Reactive Ion Etching (RIE) forming an intaglio or engraved pattern in the substrate. This type of etching does not destroy the resist and provides an extremely smooth surface on the lateral sides of the intaglio pattern since it has a preferential etching direction perpendicular to the substrate surface. It is also possible to use a wet etching process, in which case, it is desirable to use a crystal substrate and to arrange the crystal structure along the directions in which the grid lines are to lie, using a technique similar to that disclosed in "Fabricating shaped grid and aperture holes" by Leone and Ting, IBM Technical Disclosure Bulletin Vol. 14, No. 2, July, 1971, pp. 417–418, which is hereby incorporated by reference. However, in this case, it would be preferable to use an etchant having a preferential etching direction in the <100> and <110> direction, rather than the <111> direction in order to form vertical sides and avoid surfaces and interfaces which could cause reflections of the electron beam. The above incorporated document also mentions the possibility of obtaining preferential etching directions though doping of the substrate. This can be particularly advantageous in the present invention since doping of the substrate or grid body also increases conductivity of the grid to further avoid charging effects. The remainder of the resist is then removed and further RIE etching is done using the oxide mask to fully form grooves 27 as shown in FIG. 2c. This further etching also serves to remove a substantial portion if not all of the oxide layer. The remainder of the oxide layer is then removed, preferably with buffered Hydrofluoric acid ($NH_4F+HF$) or with Reactive Ion Etching with $CF_4$ or $CHF_3+$Argon. Then, a dense metal such as gold, but preferably tungsten, is layered over the surface of the substrate including the grooves. The choice of material is based on the contrast of electron backscatter relative to the substrate material which different materials will provide. The amount of backscatter is predominantly a function of the density of the material and gold and tungsten are much preferred. Tungsten is preferred to gold since it provides about 90% of the contrast obtainable from gold but is a much stronger and harder material and less expensive. Tungsten also bonds well to silicon and other semiconductor materials and does not require the aforementioned thin chromium coating to improve adhesion of gold to the silicon, allowing omission of such a step in the manufacturing process. Other materials may also be used to form the grid but may require the use of contrast enhancing electronics to obtain a sufficient signal-to-noise ratio.

Finally, the surface of the grid is formed by polishing, preferably with diamond dust, to remove the excess metal other than in the grooves, thus separating grid lines 28 and achieving a planar surface 29 where the grid lines are coplanar with the grid body surface.

It should be noted that silicon has been mentioned as a possible substrate material. In fact, any of crystalline, polycrystalline and amorphous forms of silicon or other semiconductor materials may be appropriate, depending on the particular product being produced in conjunction with the electron beam lithography operation. Other materials are, of course, possible as long as the characteristic backscatter of the material contrasts well with the material chosen to form the grid. The principal criterion for extremely high calibration accuracy is the matching of the thermal characteristics of the calibration grid with the substrate material underlying the resist to be exposed so that the calibration grid will expand and contract exactly with the device or mask being created so that registration between layers formed at different times will be maintained.

From the foregoing, it is evident that the invention provides an improved calibration grid structure which allows for cleaning and reuse of the calibration grid after unavoidable contamination during use takes place as well as a novel method of fabricating such a calibration grid which produces a calibration grid of much reduced grid line edge roughness, resulting in a calibration grid of greatly improved quality. The improved quality of the calibration grid may be exploited in many ways such as reducing the number of sweeps of the calibration grid necessary to reduce the effects of grid line edge roughness of the prior art grids and to produce masks, integrated circuit electronic devices and the like with higher overlay accuracy, integration density and yield. The ability of the improved grid structure to withstand cleaning also reduces the cost of electron beam lithography attributable to the calibration grid and thereby reduces the cost of the overall process and the products made thereby. The use of the invention may also allow some misregistration tolerant integrated circuit designs to be omitted, allowing increased flexibility of integrated circuit design without risk of reduction of manufacturing yields. Moreover, since the invention may be implemented in electron beam lithography devices and processes without alteration of the process other than allowing for grid surface renewal or cleaning as may, from time to time, be necessary, no constraint on the use of the machine or the electron beam lithography method is imposed by the use of the improved grid according to the invention. Therefore, it is seen that the scope of the invention includes not only the grid and methods for its manufacture but also the method of operating an electron beam lithography machine at reduced operational cost and improved products produced at such reduced cost by means of the electron beam lithography process implemented by means of the invention.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A calibration grid comprising
    a body having at least one groove in an exterior surface thereof and
    a material located in said at least one groove of said exterior surface of said body, said material having an electron backscattering characteristic which substantially differ from that of said body.

2. A calibration grid as recited in claim 1, wherein said material includes at least one of gold and tungsten.

3. A calibration grid as recited in claim 1 wherein a boundary between said groove and said material is smooth and highly linear in a direction parallel to said groove.

4. A calibration grid as recited in claim 1, wherein said surface of said body and a surface of said material which is not adjacent to said body are coplanar.

5. A calibration grid as recited in claim 3, wherein said surface of said body and a surface of said material which is not adjacent to said body are coplanar.

6. A grid comprising a body and grid lines of a material having an electron backscattering characteristic substantially differing from that of said body, said grid lines being located at a surface of said body wherein said body includes means for laterally supporting said grid lines in a direction parallel to said surface.

7. A grid as recited in claim 6, wherein said material includes at least one of gold and tungsten.

8. A grid as recited in claim 7, wherein said means for laterally supporting said grid lines comprises at least one groove formed in an exterior surface of said body.

9. A method of operating an electron beam lithography machine having a calibration grid including the step of cleaning said calibration grid.

10. A method of cleaning a calibration grid for an electron beam lithography machine including a step of polishing a surface of said calibration grid.

11. A method of cleaning a calibration grid as recited in claim 10, wherein said polishing step includes polishing said surface with a diamond powder.

12. A method of making a calibration grid for an electron beam lithography machine including a step of polishing a surface of said calibration grid.

13. A method of making a calibration grid as recited in claim 12, wherein said polishing step includes polishing said surface with a diamond powder.

* * * * *